US012657445B2

(12) United States Patent
Choi et al.

(10) Patent No.: US 12,657,445 B2
(45) Date of Patent: Jun. 16, 2026

(54) SYNAPTIC DEVICE, NEUROMORPHIC DEVICE INCLUDING SYNAPTIC DEVICE, AND OPERATING METHODS THEREOF

(71) Applicants: SK hynix Inc., Icheon (KR); Korea Advanced Institute of Science and Technology, Daejeon (KR)

(72) Inventors: Yang Kyu Choi, Daejeon (KR); Ji Man Yu, Daejeon (KR)

(73) Assignees: SK hynix Inc., Icheon (KR); Korea Advanced Institute of Science and Technology, Daejeon (KR)

( * ) Notice: Subject to any disclaimer, the term of this patent is extended or adjusted under 35 U.S.C. 154(b) by 682 days.

(21) Appl. No.: 18/302,772

(22) Filed: Apr. 18, 2023

(65) Prior Publication Data

US 2023/0419089 A1 Dec. 28, 2023

(30) Foreign Application Priority Data

Jun. 24, 2022 (KR) ........................ 10-2022-0077435

(51) Int. Cl.
| | |
|---|---|
| *G06N 3/063* | (2023.01) |
| *G06N 3/049* | (2023.01) |
| *G11C 11/54* | (2006.01) |
| *G11C 16/04* | (2006.01) |
| *H10B 43/20* | (2023.01) |
| *H10B 43/40* | (2023.01) |

(Continued)

(52) U.S. Cl.
CPC ............. *G06N 3/063* (2013.01); *G06N 3/049* (2013.01); *G11C 11/54* (2013.01); *G11C 16/0466* (2013.01); *H10B 43/20* (2023.02);

*H10B 43/40* (2023.02); *H10D 30/62* (2025.01); *H10D 30/69* (2025.01)

(58) Field of Classification Search
None
See application file for complete search history.

(56) References Cited

U.S. PATENT DOCUMENTS

| | | | | |
|---|---|---|---|---|
| 7,394,127 B2 * | 7/2008 | Kim | ................... | H10D 30/0413 |
| | | | | 257/E21.21 |
| 10,930,608 B2 * | 2/2021 | Or-Bach | ................. | H10P 72/74 |
| 2023/0282275 A1 * | 9/2023 | Lee | ........................ | G06N 3/063 |

FOREIGN PATENT DOCUMENTS

| | | |
|---|---|---|
| KR | 102018792 B1 | 9/2019 |
| KR | 102296439 B1 | 9/2021 |

(Continued)

*Primary Examiner* — Nishath Yasmeen

(57) ABSTRACT

A synaptic device, a neuromorphic device including the synaptic device, and operating methods thereof are disclosed. A synaptic device may comprise a channel, a charge trap layer directly contacting the channel, a blocking insulating layer disposed on the charge trap layer, a control electrode disposed on the blocking insulating layer, a first terminal connected to a first region of the channel, and a second terminal connected to a second region of the channel. The synaptic device may change a post-synaptic current (PSC) and control synaptic plasticity according to a control signal applied to the control electrode. The synaptic device may have a SONS (doped poly-silicon/blocking oxide/charge trap nitride/silicon channel) structure. The synaptic device may have SADP characteristics, SDDP characteristics, SFDP characteristics, SNDP characteristics, and STDP characteristics.

20 Claims, 9 Drawing Sheets

(51) Int. Cl.
    *H10D 30/62*         (2025.01)
    *H10D 30/69*         (2025.01)

(56)               References Cited

FOREIGN PATENT DOCUMENTS

| | | | |
|---|---|---|---|
| KR | 1020220006988 A | 1/2022 | |
| KR | 1020220014794 A | 2/2022 | |

* cited by examiner

< Biological synapse >

< SADP >

< SDDP >

< SFDP >

< STDP >

*FIG. 12*

SYNAPTIC DEVICE, NEUROMORPHIC DEVICE INCLUDING SYNAPTIC DEVICE, AND OPERATING METHODS THEREOF

CROSS REFERENCE TO RELATED APPLICATION

The present application claims, under 35 U.S.C. § 119(a), the benefit of Korean application No. 10-2022-0077435, filed on Jun. 24, 2022, which is herein incorporated by reference in its entirety.

BACKGROUND

1. Field

Embodiments of the present invention relate to an electronic device, an apparatus including the same, and operating methods thereof, and more particularly, to a synaptic device, a neuromorphic device including the same, and operating methods thereof.

2. Description of the Related Art

As the scaling reduction of transistors reaches its limit, a neuromorphic computing system is attracting a lot of attention as a new concept which may overcome the limitations of the existing von Neumann computer system. Neuromorphic computing is to implement artificial intelligence operations by imitating the human brain in a hardware manner. Based on the fact that the human brain performs very complex functions but consumes only about 20 W of energy, neuromorphic computing may imitate the structure of the human brain itself and may perform artificial intelligence operations of association, reasoning, and recognition that are superior to the existing von Neumann method computing with ultra-low power.

A neuromorphic system which enables such neuromorphic computing is composed of numerous neurons (neuron devices) and synapses (synaptic devices) like the human brain, and includes additional circuits for signal processing and transmission. The synapse remembers the connection strength (weight) according to the correlation of the spikes expressed by the neurons, and adjusts the connection weight through the process of strengthening/potentiation and suppression/depression as needed. As synaptic devices, resistive random access memory (RRAM) and memristor-based devices have been extensively studied, and recently, metal-oxide-semiconductor field-effect transistor (MOSFET)-based synaptic devices have also been studied.

However, the existing synaptic devices have issues, such as insufficient imitation related to various synaptic behaviors of biological synapses and poor process compatibility with general CMOS (complementary metal oxide semiconductor) technology.

SUMMARY

A technological object to be achieved by embodiments of the present disclosure is to provide a synaptic device capable of simulating (imitating) various synaptic behaviors of biological synapses and having excellent process compatibility with CMOS technology.

In addition, a technological object to be achieved by the present disclosure is to provide a method of operating the synaptic device.

In addition, a technological object to be achieved by the present disclosure is to provide a neuromorphic device (neuromorphic system) including the synaptic device.

The objects to be achieved by the present disclosure are not limited to the objects mentioned above, and other objects not mentioned will be understood by those skilled in the art from the description below.

According to an embodiment of the present disclosure, A synaptic device may comprise a channel, a charge trap layer directly contacting the channel, a blocking insulating layer disposed on the charge trap layer, a control electrode disposed on the blocking insulating layer, a first terminal connected to a first region of the channel, and a second terminal connected to a second region of the channel. The synaptic device may change a post-synaptic current (PSC) and control synaptic plasticity according to a control signal applied to the control electrode.

The synaptic device may have a SONS (doped poly-silicon/blocking oxide/charge trap nitride/silicon channel) structure.

The gate electrode may include silicon, the blocking insulating layer may include oxide, the charge trap layer may include nitride, and the channel may include silicon.

The synaptic device may have a characteristic in which charges trapped in the charge trap layer by the application of the gate voltage are diffused and outflowed to the channel over time.

The synaptic plasticity may be controlled according to one or more of an amplitude, a duration, a frequency, a number, and a timing of a pulse of the gate voltage.

The synaptic device has a spike amplitude dependent plasticity (SADP) characteristic, a spike duration dependent plasticity (SDDP) characteristic, a spike frequency dependent plasticity (SFDP) characteristic, a spike number dependent plasticity (SNDP) characteristic, and a spike timing dependent plasticity (STDP) characteristic.

According to another embodiment of the present disclosure, a neuromorphic device including the synaptic device described above is provided.

The neuromorphic device may further include a CMOS peripheral circuit connected to the synaptic device.

According to another embodiment of the present disclosure, there is provided an operating method of a synaptic device comprising: applying a control signal to a control electrode of the synaptic device to control a post-synaptic current (PSC) and synaptic plasticity of the synaptic device; and outputting the PSC to generate a post-spike signal. The synaptic device includes a channel member, a charge trap layer directly contacting the channel member, a blocking insulating layer disposed on the charge trap layer, the control electrode disposed on the blocking insulating layer, a first terminal connected to a first region of the channel member, and a second terminal connected to a second region of the channel member.

The synaptic device may have a SONS (doped poly-silicon/blocking oxide/charge trap nitride/silicon channel) structure.

The gate electrode may include silicon, the blocking insulating layer may include oxide, the charge trap layer may include nitride, and the channel may include silicon.

The synaptic device may have a characteristic in which charges trapped in the charge trap layer by the application of the gate voltage are diffused and outflowed to the channel over time.

The synaptic plasticity may be controlled according to at least any one of amplitude, duration, frequency, number, and timing of a pulse of the gate voltage.

The synaptic device has a spike amplitude dependent plasticity (SADP) characteristic, a spike duration dependent plasticity (SDDP) characteristic, a spike frequency dependent plasticity (SFDP) characteristic, a spike number dependent plasticity (SNDP) characteristic, and a spike timing dependent plasticity (STDP) characteristic.

According to the embodiments of the present disclosure, it is possible to implement a synaptic device capable of imitating various synaptic behaviors of biological synapses, and having excellent process compatibility with CMOS technology, and an operation method thereof. In particular, it is possible to implement a synaptic device in which a post-synaptic current (PSC) is changed and synaptic plasticity is easily controlled according to the application condition of the gate voltage applied to the gate electrode.

More specifically, in connection with the synaptic device according to the embodiment, for example, synaptic plasticity may be controlled according to the amplitude, duration, frequency, number and timing of a pulse signal applied to the gate electrode, and it may exhibit a spike amplitude dependent plasticity (SADP) characteristic, a spike duration dependent plasticity (SDDP) characteristic, a spike frequency dependent plasticity (SFDP) characteristic, a spike number dependent plasticity (SNDP) characteristic, and a spike timing dependent plasticity (STDP) characteristic. In addition, the synaptic device according to the embodiment may be 100% compatible with conventional CMOS technology.

Therefore, the synaptic device according to the embodiment may be used as an artificial synapse which may replace a biological synapse, and may be usefully employed in a neuromorphic device (neuromorphic system) and a neural network.

However, the effects of embodiments of the present disclosure are not limited to the above effects, and may be variously extended without departing from the technological spirit and scope of the present invention.

BRIEF DESCRIPTION OF THE DRAWINGS

FIG. 12 is a circuit diagram showing a synaptic array device to which a synaptic device according to an embodiment of the present disclosure is applied as a unit device.

DETAILED DESCRIPTION

Figure 1:
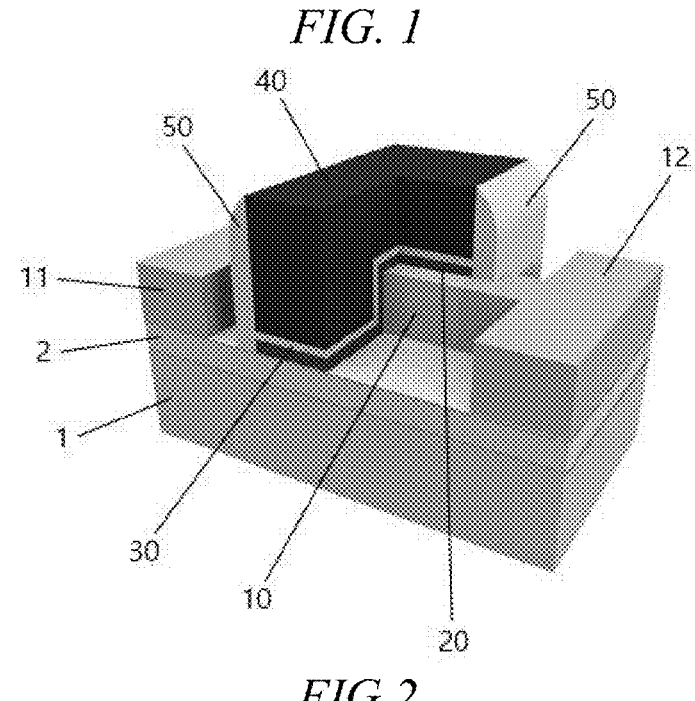
FIG. 1 is a perspective view showing a synaptic device according to an embodiment of the present disclosure.

Hereinafter, embodiments of the present disclosure will be described in detail with reference to the accompanying drawings.

These embodiments of the present disclosure to be described below are provided to more clearly explain the embodiments of the present disclosure to those having common knowledge in the related art, and the scope of the present disclosure is not limited by the following embodiments. The following embodiment may be modified in many different forms.

The terminology used herein is used to describe specific embodiments, and is not used to limit embodiments of the present disclosure. As used herein, terms in the singular form may include the plural form unless the context clearly dictates otherwise. Also, as used herein, the terms "comprise" and/or "comprising" specifies presence of the stated shape, step, number, action, member, element and/or group thereof; and does not exclude presence or addition of one or more other shapes, steps, numbers, actions, members, elements, and/or groups thereof. In addition, the term "connection" as used herein is a concept that includes not only that certain members are directly connected, but also a concept that other members are further interposed between the members to be indirectly connected.

In addition, in the present disclosure, when a member is said to be located "on" another member, this includes not only a case in which a member is in contact with another member but also a case in which another member is present between the two members. As used herein, the term "and/or" includes any one and any combination of one or more of those listed items. In addition, as used herein, terms such as "about", "substantially", etc. are used as a range of the numerical value or degree, in consideration of inherent manufacturing and material tolerances, or as a meaning close to the range. Furthermore, accurate or absolute numbers provided to aid the understanding of the present application are used to prevent an infringer from using embodiments of the present disclosure unfairly.

Hereinafter, the embodiments of the present disclosure will be described in detail with reference to the accompanying drawings. The size or the thickness of the regions or the parts illustrated in the accompanying drawings may be slightly exaggerated for clarity and convenience of description. The same reference numerals may refer to the same elements throughout the detailed description.

FIG. 1 is a perspective view showing a synaptic device according to an embodiment of the present disclosure.

Referring to FIG. 1, the synaptic device according to an embodiment of the present disclosure may include a channel 10 (i.e., channel member), a charge trap layer 20 in direct contact with the channel 10, and a blocking insulating layer 30 disposed on the charge trap layer 20, a control electrode (e.g., a gate electrode) 40 disposed on the blocking insulating layer 30, a first terminal (e.g., a source) 11 connected to (e.g., contacted with) a first region (e.g., a first end portion) of the channel 10, and a second terminal (e.g., a drain) 12 connected to (e.g., contacted with) a second region (e.g., a second end portion) of the channel 10. The channel 10 may be disposed between the source 11 and the drain 12, and the charge trap layer 20, the blocking insulating layer 30, and the gate electrode 40 may be sequentially disposed on the channel 10. The charge trap layer 20 may be disposed between the channel 10 and the blocking insulating layer 30, and the blocking insulating layer 30 may be disposed between the charge trap layer 20 and the gate electrode 40. Here, the charge trap layer 20 may directly contact a surface of the channel 10. When the charge trap layer 20, the blocking insulating layer 30, and the gate electrode 40 constitute a stack structure, a sidewall insulating layer 50 may be further formed on a sidewall (both sidewalls) of the stack structure. In FIG. 1, for convenience, portions of the charge trap layer 20, the blocking insulating layer 30, the gate electrode 40, and the side wall insulating layer 50 are shown in a cut-off form.

The synaptic device may be formed on a predetermined substrate structure. The substrate structure may include, for example, a silicon-on-insulator (SOI) substrate. The SOI substrate may include a lower substrate layer 1, and an insulating layer 2 and an upper substrate layer sequentially disposed thereon. The upper substrate layer may include silicon, and the channel 10, the source 11, and the drain 12 may be formed from the upper substrate layer. However, the use of the SOI substrate is merely an example, and a general semiconductor substrate other than the SOI substrate may be used. For example, the synaptic device may be formed on various substrates such as a silicon substrate, a germanium substrate, a silicon-germanium substrate, and a silicon carbide substrate.

According to an embodiment of the present disclosure, a post-synaptic current (PSC) of the synaptic device may be changed and synaptic plasticity of the synaptic device may be controlled according to application (e.g., an application condition) of a control signal (e.g., a gate voltage) applied to the gate electrode 40. Depending on the application condition of the gate voltage, the fluctuation range (variation range) of the post-synaptic current (PSC) may be changed, and the synaptic plasticity may be strengthened or weakened. In this regard, the synaptic device according to embodiments of the present disclosure may be capable of simulating various synaptic behaviors of biological synapses. This will be described in detail with reference to FIGS. 5 to 10 later.

According to an embodiment, the gate electrode 40 may include silicon, the blocking insulating layer 30 may include oxide, the charge trap layer 20 may include nitride, and the channel may include silicon. As a more specific example, the gate electrode 40 may include highly doped polycrystalline silicon, the blocking insulating layer 30 may include silicon oxide (e.g., $SiO_2$), the charge trap layer 20 may include silicon nitride (e.g., $Si_3N_4$), and the channel 10 may include single-crystal silicon or polycrystalline silicon. Therefore, it may be said that the synaptic device has a SONS (doped poly-silicon/blocking oxide/charge trap nitride/silicon channel) structure. In other words, the synaptic device may have a SONS structure that includes silicon (e.g., highly doped polycrystalline silicon) as the gate electrode 40, oxide (e.g., silicon oxide) as the blocking insulating layer 30, nitride (e.g., silicon nitride) as the charge trap layer 20, and silicon (e.g., single-crystal silicon or polycrystalline silicon) as the channel 10.

As such, the synaptic device has a structure in which the channel 10 and the charge trap layer 20 are in direct contact with each other without a tunnel insulation layer (e.g., tunneling oxide layer) between them. In this regard, the synaptic device may exhibit characteristics similar to biological synapses. For example, the synaptic device may exhibit characteristics in which charges trapped in the charge trap layer 20 by the application of the gate voltage are diffused and out flowed to the channel 10 relatively quickly over time. This may be said to be a characteristic similar to the increase in action potential due to ion inflow and the decrease in potential due to ion outflow, which appear in the neurotransmission process of an actual biological synapse. This will be described in more detail with reference to FIGS. 2 and 3 below.

Since the synaptic device is similar to biological synapses, just as the plasticity of actual biological synapse is controlled according to the amplitude, duration, frequency, number, timing, etc. of stimulation based on these characteristics, synaptic plasticity of the synaptic device may also be controlled in a similar manner. The synaptic plasticity of the synaptic device may be controlled according to one or more of an amplitude, a duration, a frequency, a number, and a timing of a pulse (pulse signal) of the gate voltage applied to the gate electrode 40. For example, a number may indicate a number of applied pulses to the gate electrode 40, and a timing may indicate a time interval between a pair of pulses of the gate voltage. In this regard, the synaptic device may have a spike amplitude dependent plasticity (SADP) characteristic, a spike duration dependent plasticity (SDDP) characteristic, a spike frequency dependent plasticity (SFDP) characteristic, a spike number dependent plasticity (SNDP) characteristic, and a spike timing dependent plasticity (STDP) characteristic. Therefore, the synaptic device according to the embodiment may be used as an artificial synapse which may replace a biological synapse, and may be usefully employed in a neuromorphic device, a neuromorphic system, and/or a neural network. In contrast, conventional synaptic devices include a tunnel insulation layer (e.g., tunneling oxide layer) between a charge trap layer and a channel portion, which may interrupt diffusion of charge carriers trapped in the charge trap layer into the charge region when a gate voltage is applied. As a result, the conventional synaptic devices do not exhibit one or more characteristics (e.g., SADP, SDDP, SFDP, SNDP, and STDP characteristics) sufficiently similar to those of synaptic devices according to embodiments of the present disclosure and those of a biological synapse.

In addition, the synaptic device may have excellent process compatibility with CMOS technology. Since the synaptic device, for example, may have the above-described SONS structure, it may be compatible with conventional CMOS technology. Accordingly, it is possible to easily manufacture a CMOS-type peripheral circuit connected to the synaptic device, and to easily manufacture a neuromorphic device and/or a neuromorphic system having excellent performance.

Additionally, the synaptic device may have a fin field effect transistor (FinFET) structure. The channel 10 may be disposed on an upper surface of the insulating layer 2 so as to protrude upwardly, and the charge trap layer 20, the blocking insulating layer 30, and the gate electrode 40 may be arranged to cover (surround) an upper surface and both side surfaces of the channel 10. The performance of the synaptic device may be further improved by such a FinFET structure. However, embodiments of the present disclosure are not limited thereto. For example, a synaptic device according to another embodiment may have a planar-type transistor structure or a gate-all-around (GAA) transistor structure other than the FinFET structure.

In addition, in the synaptic device, a thickness of the channel 10 may be, for example, about 1 to 50 nm, and a thickness of the charge trap layer 20 may be, for example, about 1 to 10 nm. A thickness of the blocking insulating layer 30 may be, for example, about 1 to 10 nm. However, the thickness ranges of each of the channel 10, the charge trap layer 20, and the blocking insulating layer 30 are merely examples and may vary depending on circumstances.

The synaptic device may be referred to as a charge-trap device which may be modulated by a gate, and synaptic plasticity of the synaptic device may be controlled by using a gate voltage.

Figure 2:
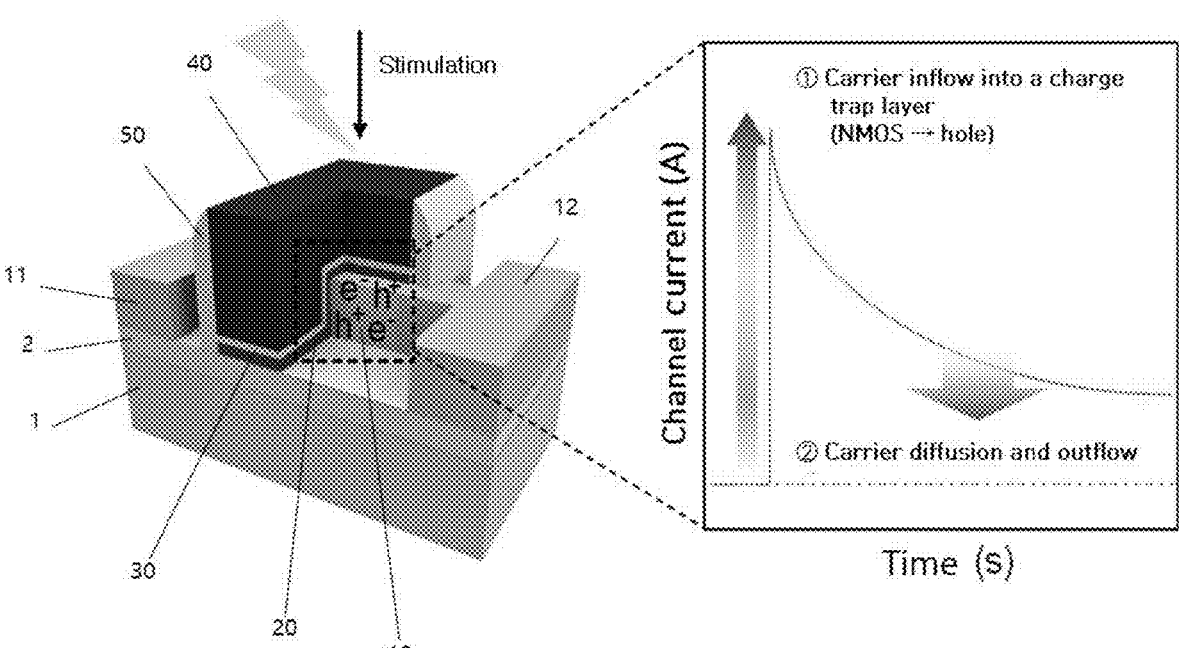
FIG. 2 is a diagram showing charge trap and leakage characteristics of a synaptic device according to an embodiment of the present disclosure.
Figure 3:
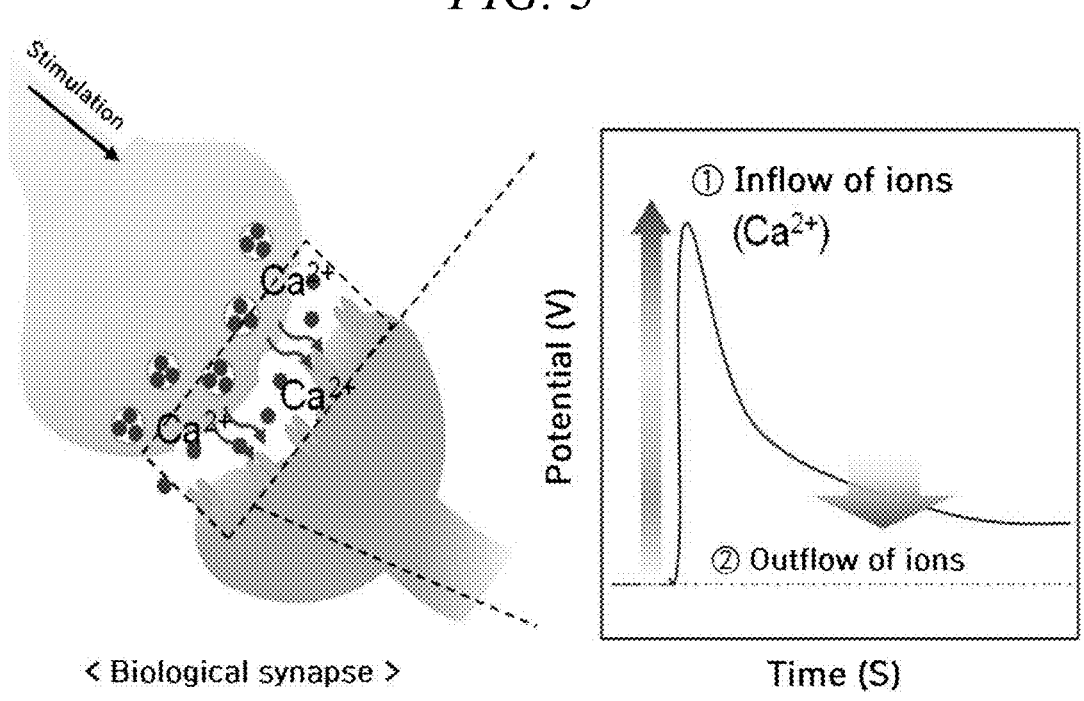
FIG. 3 is a diagram showing ion inflow and outflow characteristics in an actual biological synapse.

FIG. 2 and FIG. 3 are diagrams for explaining the similarity between a synaptic device according to an embodiment of the present disclosure and an actual biological synapse.

FIG. 2 is a diagram showing charge trap and leakage characteristics of a synaptic device according to an embodiment of the present disclosure.

Referring to FIG. 2, the synaptic device according to the embodiment of the present disclosure may have a structure in which the channel 10 and the charge trap layer 20 are in direct contact with each other without a tunnel insulating layer between them. Accordingly, the synaptic device may exhibit characteristics in which the charges trapped in the charge trap layer 20 due to an application of stimulus (e.g., a gate voltage) are diffused and outflowed to the channel 10 within a relatively short time. As the charges (the charge carriers) are trapped in the charge trap layer 20, the channel current rapidly increases, and then as the charges (the charge carriers) diffuse into the channel 10 and flow out, the channel current may decrease. This may be a characteristic similar to an increase in action potential due to ion inflow and a decrease in potential due to ion outflow, which occur in a neurotransmission process of an actual biological synapse.

For example, when a negative (−) voltage is applied to the gate electrode 40 as the gate voltage, positive (+) charges, that is, holes may be trapped in the channel 10, and the trapped holes may flow out to the channel 10 within a relatively short period of time after application of the gate voltage. In another case, when a positive (+) voltage is applied to the gate electrode 40 as the gate voltage, negative (−) charges, that is, electrons may be trapped in the channel 10, and the trapped electrons may flow out to the channel 10 within a relatively short time after application of the gate voltage.

A synaptic device according to an embodiment of the present disclosure may have a SONS structure, and may have the above-described charge trapping and draining characteristics due to the SONS structure. In the case of a transistor having a conventional SONOS (silicon/oxide/nitride/oxide/silicon) structure, since it includes a tunnel insulating layer, the charges trapped in the trap layer may not show the characteristic of flowing out due to diffusion, and the simulation characteristics for biological synapses may be degraded. However, the synaptic device according to the embodiment of the present disclosure may have the above-described charge trapping and draining characteristics, which may be usefully utilized in simulating synaptic behavior.

FIG. 3 is a diagram showing ion inflow and ion outflow characteristics in an actual biological synapse.

Referring to FIG. 3, during the neurotransmission process of an actual biological synapse, an action potential may increase due to ion inflow into the synapse (e.g., synaptic gap) and potential may decrease due to ion outflow. The potential may increase rapidly as ions enter the synapse (e.g., synaptic gap), and then ions may flow out and the potential may decrease within a relatively short time over time. This may be similar to the charge trap and leakage characteristics of the synaptic device according to the embodiment described with reference to FIG. 2.

Since the synaptic device is sufficiently similar to biological synapses, just as the plasticity of actual biological synapse is controlled according to the amplitude, duration, frequency, number, timing, etc. of stimulation based on these characteristics, synaptic plasticity of the synaptic device may also be controlled in a similar manner. The synaptic plasticity of the synaptic device may be easily controlled according to one or more of an amplitude, a duration, a frequency, a number, and a timing of a pulse (pulse signal) of the gate voltage applied to the gate electrode 40. In this regard, the synaptic device may have a spike amplitude dependent plasticity (SADP) characteristic, a spike duration dependent plasticity (SDDP) characteristic, a spike frequency dependent plasticity (SFDP) characteristic, a spike number dependent plasticity (SNDP) characteristic, and a spike timing dependent plasticity (STDP) characteristic. Therefore, the synaptic device according to an embodiment may be used as an artificial synapse which may replace a biological synapse, and may be usefully employed in a neuromorphic device, a neuromorphic system, and/or a neural network.

Figure 4:
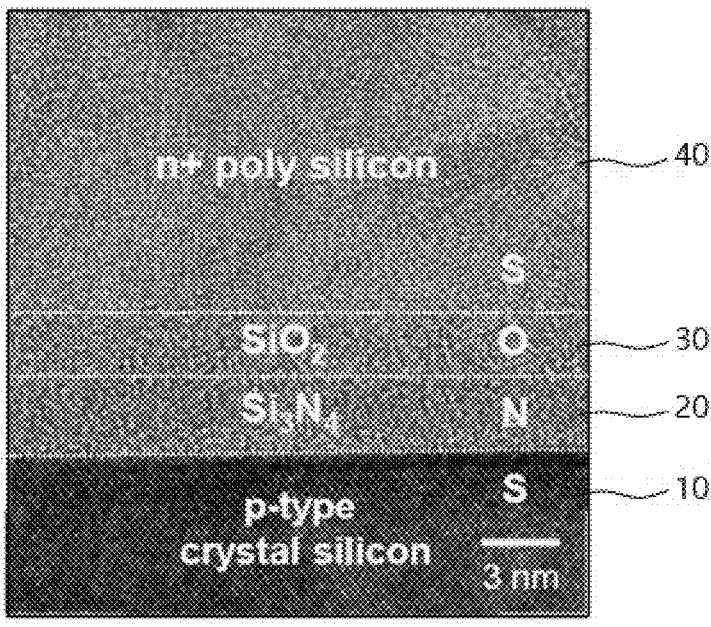
FIG. 4 is a TEM (transmission electron microscope) photographic image showing a stack structure which a synaptic device according to an embodiment of the present disclosure may have.

FIG. 4 is a TEM (transmission electron microscope) photographic image showing a stack structure of a synaptic device according to an embodiment of the present disclosure.

Referring to FIG. 4, the synaptic device according to the embodiment may have a SONS (doped poly-silicon/blocking oxide/charge trap nitride/silicon channel) structure. The gate electrode 40 of the synaptic device may include silicon, the blocking insulating layer 30 may include oxide, the charge trap layer 20 may include nitride, and the channel 10 may include silicon. The gate electrode 40 may include highly doped polycrystalline silicon, the blocking insulating layer 30 may include silicon oxide (e.g., $SiO_2$), the charge trap layer 20 may include silicon nitride (e.g., $Si_3N_4$), and the channel 10 may include monocrystalline silicon or polycrystalline silicon. The SONS structure may be, for example, an n+ poly-silicon/$SiO_2$/$Si_3N_4$/p-type cystal silicon structure. However, the doping type of the gate electrode 40, the semiconductor type of the channel 10, and the specific material compositions of the charge trap layer 20 and the blocking insulating layer 30 may vary according to embodiments. The synaptic device may have properties (e.g., a property that a potential increases and then quickly decreases) similar to biological synapses due to the SONS structure.

Figure 5:
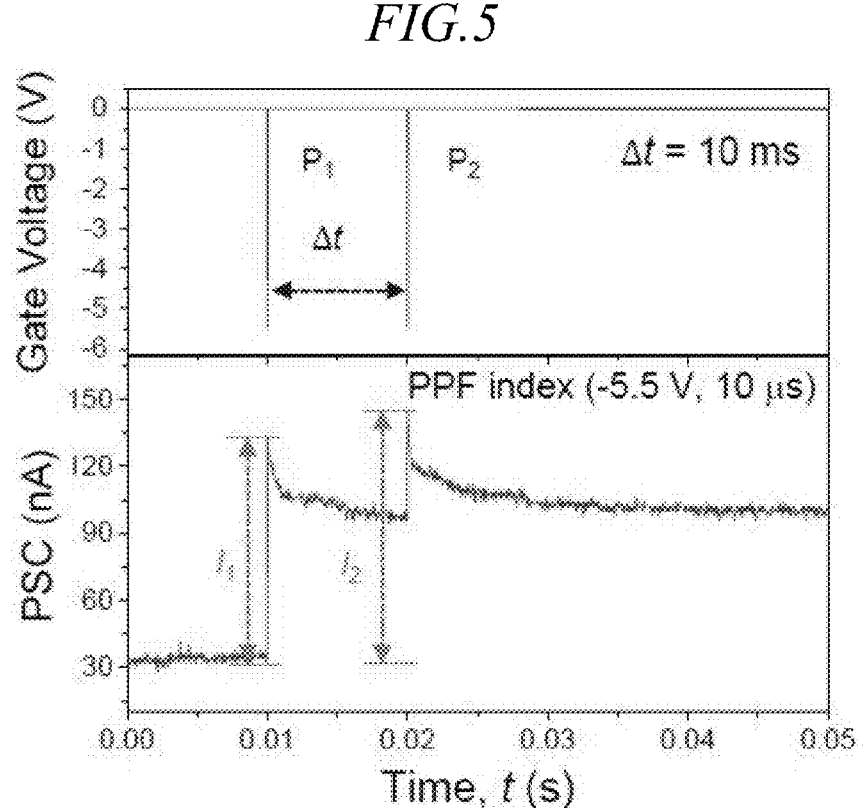
FIG. 5 is a graph showing how the post-synaptic current (PSC) of the synaptic device changes when a gate voltage (pulse voltage) is applied to the gate electrode of the synaptic device according to an embodiment of the present disclosure.

FIG. 5 is a graph showing how the post-synaptic current (PSC) of the synaptic device changes when a gate voltage (pulse voltage) ($P_1$, $P_2$) is applied to the gate electrode of the synaptic device according to an embodiment of the present disclosure. The post-synaptic current (PSC) may be a current between a source and a drain.

Referring to FIG. 5, when each of a pair of the gate voltages (pulse voltages) $P_1$ and $P_2$ is applied to the gate electrode of the synaptic device, it may be seen that the post-synaptic current (PSC) increases and decreases similarly to change of the potential (action potential) of the biological synapse. In addition, when stimuli (e.g., first and second gate voltages $P_1$ and $P_2$) are closely paired, it may be seen that the post-synaptic current (PSC) increases remarkably in response to the second stimulus (e.g., the second gate voltage $P_2$). This may be referred to as a paired-pulse facilitation (PPF) characteristic. For example, referring to FIG. 5, when the second gate voltage $P_2$ follows the first gate voltage $P_1$ after a relatively short time interval (e.g., 10 ms), the magnitude of the post-synaptic current increases to a second magnitude $I_2$ when the second gate voltage $P_2$ is applied, such that the second magnitude $I_2$ is significantly greater than a first magnitude $I_1$ of the post-synaptic current when the first gate voltage $P_1$ is applied.

Figure 6:
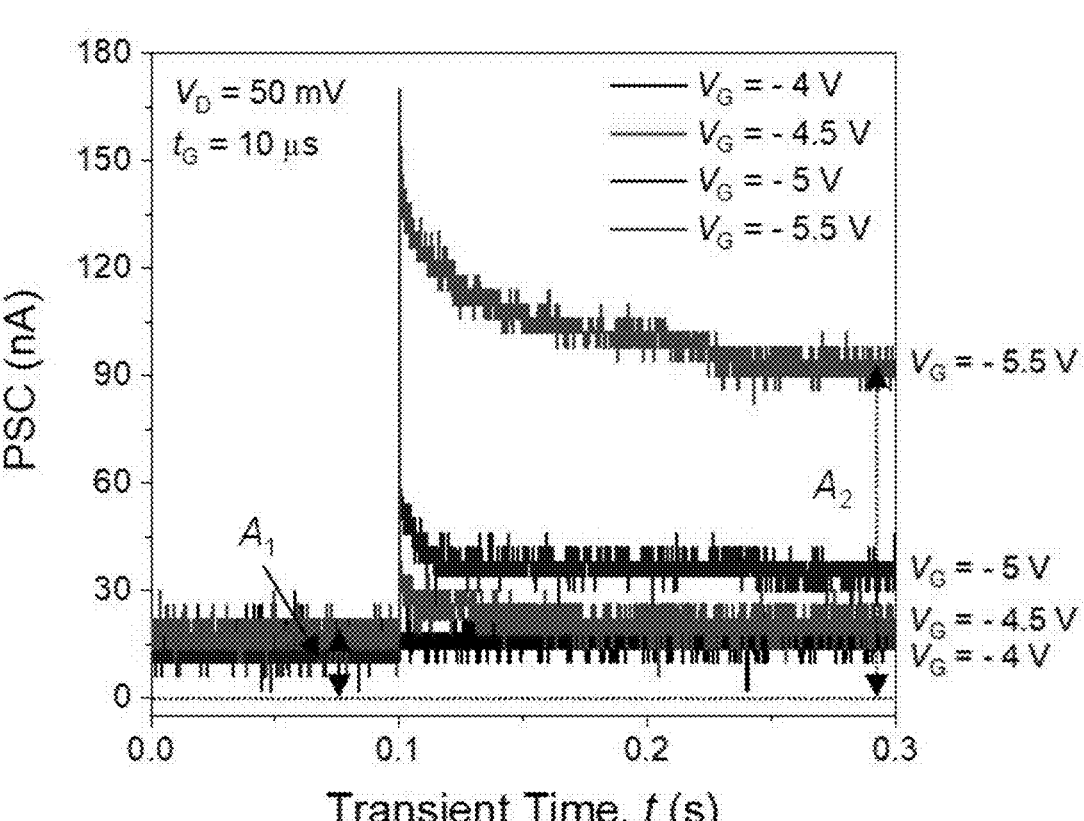
FIG. 6 is a characteristic evaluation graph showing spike amplitude dependent plasticity (SADP) characteristics of a synaptic device according to an embodiment of the present disclosure.

FIG. 6 is a characteristic evaluation graph showing spike amplitude dependent plasticity (SADP) characteristics of a synaptic device according to an embodiment of the present disclosure.

Referring to FIG. 6, as an amplitude of stimulus (e.g., the gate voltage $V_G$) applied to the gate electrode of the synaptic device increases, it may be seen that the increment of the post-synaptic current (PSC) increases. This also appears in biological synapses, and is called as the SADP characteristic. In FIG. 6, $V_D$ represents the drain voltage and t G represents the duration of the gate voltage. The gate voltage $V_G$ was applied at the time point of 0.1 second.

Figures 7, 8:
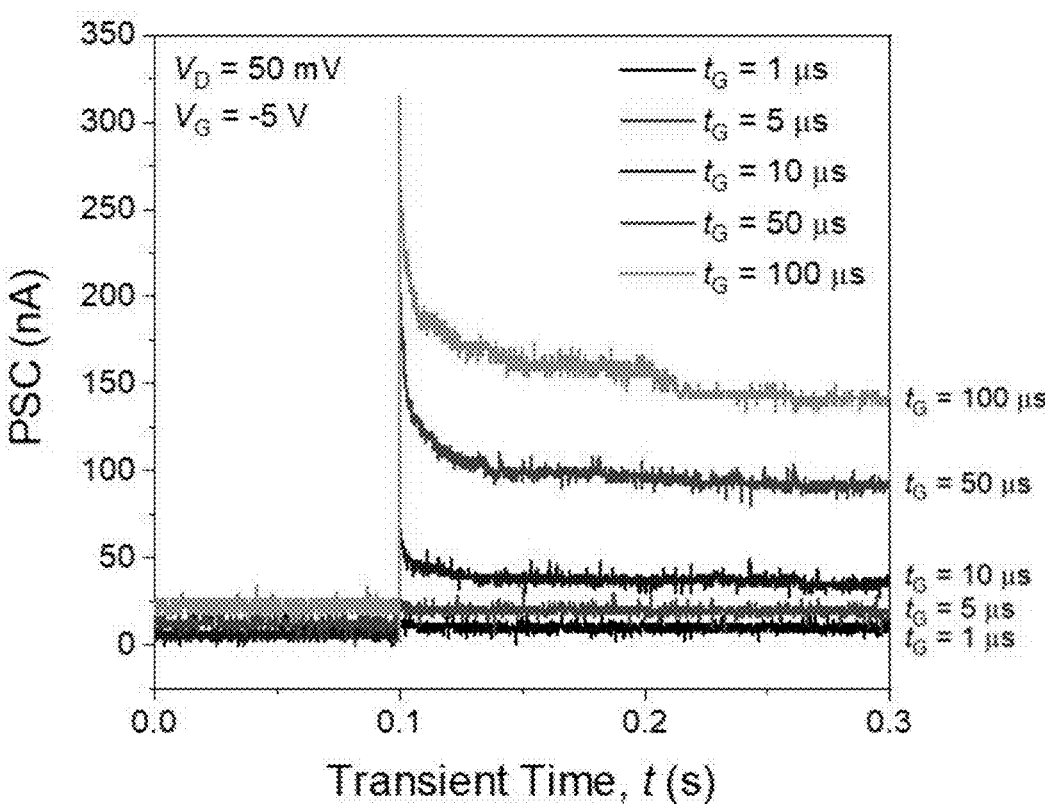
FIG. 7 is a characteristic evaluation graph showing spike duration dependent plasticity (SDDP) characteristics of a synaptic device according to an embodiment of the present disclosure.
FIG. 8 is a characteristic evaluation graph showing spike frequency dependent plasticity (SFDP) characteristics of a synaptic device according to an embodiment of the present disclosure.

FIG. 7 is a characteristic evaluation graph showing spike duration dependent plasticity (SDDP) characteristics of a synaptic device according to an embodiment of the present disclosure.

Referring to FIG. 7, as a duration $t_G$ of stimulus (e.g., the gate voltage $V_G$) applied to the gate electrode of the synaptic device increases, it may be seen that the increment of the post-synaptic current (PSC) increases. This also appears in biological synapses, and is called as the SDDP characteristic. The gate voltage $V_G$ was applied at the time point of 0.1 second.

FIG. 8 is a characteristic evaluation graph showing spike frequency dependent plasticity (SFDP) characteristics of a synaptic device according to an embodiment of the present disclosure.

Referring to FIG. 8, as a frequency of stimulus (e.g., the gate voltage $V_G$) applied to the gate electrode of the synaptic device increases, a phenomenon that the amount of change in the post-synaptic current (PSC), that is, $\Delta W$ (%) increases may be seen. For example, when a frequency of pulses applied to the gate electrode of the synaptic device during a predetermined time interval increases while keeping the magnitudes and durations of the pulses substantially the same, the amount of change in the post-synaptic current (PSC) during the time interval increases as shown in FIG. 8. This also appears in biological synapses, and is called as the SFDP characteristic.

Figure 9:
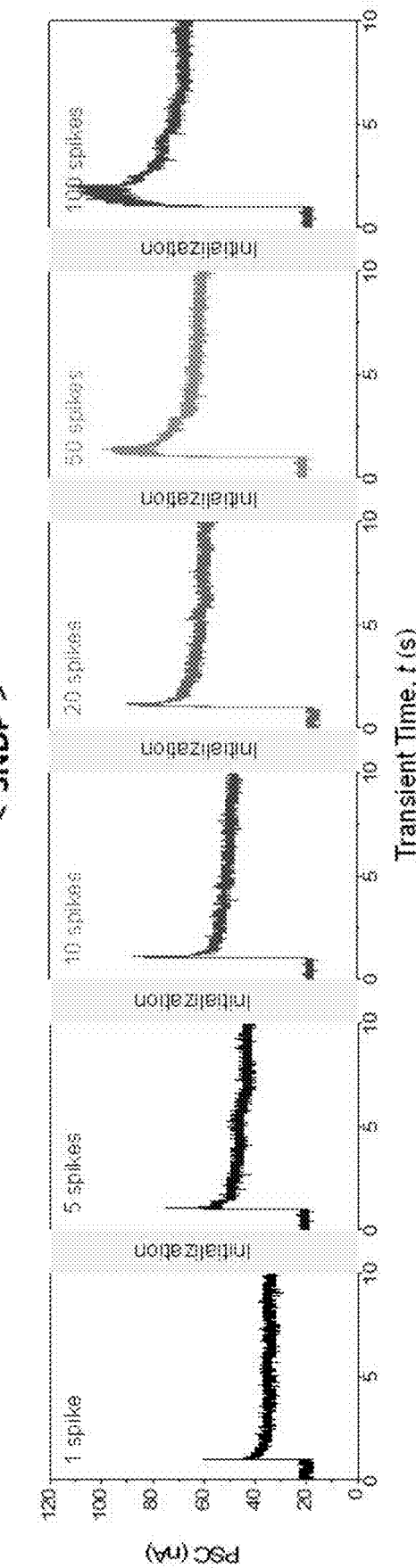
FIG. 9 is a characteristic evaluation graph showing spike number dependent plasticity (SNDP) characteristics of a synaptic device according to an embodiment of the present disclosure.

FIG. 9 is a characteristic evaluation graph showing spike number dependent plasticity (SNDP) characteristics of a synaptic device according to an embodiment of the present disclosure.

Referring to FIG. 9, as the number of stimuli (e.g., gate voltage) having the same frequency increases, it may be seen that the increment of the post-synaptic current (PSC) of the synaptic device increases. For example, when a number of pulses applied to the gate electrode of the synaptic device increases while keeping the frequencies, magnitudes, and durations of the pulses substantially the same, the increment of the post-synaptic current (PSC) (e.g., the maximum increase in magnitude of the PSC) of the synaptic device increases as shown in FIG. 9. As the number of spikes of the stimulus increased from 1 to 100, the post-synaptic current (PSC) increased significantly. This phenomenon also appears in biological synapses, and is referred to as an SNDP characteristic.

Figure 10:
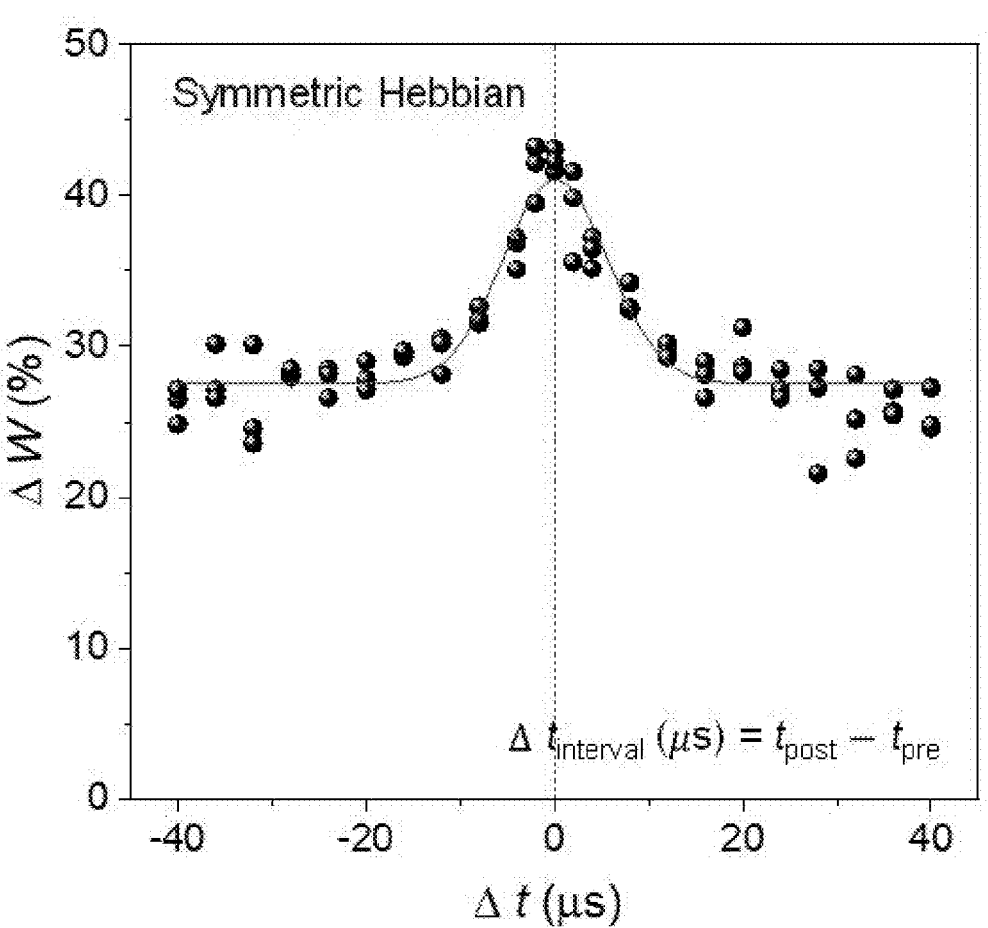
FIG. 10 is a characteristic evaluation graph showing spike timing dependent plasticity (STDP) characteristics of a synaptic device according to an embodiment of the present disclosure.

FIG. 10 is a characteristic evaluation graph showing spike timing dependent plasticity (STDP) characteristics of a synaptic device according to an embodiment of the present disclosure.

Referring to FIG. 10, a phenomenon that the amount of change in post-synaptic current (PSC), that is, $\Delta W$ (%) changes according to the timing (i.e., the pre/post interval) at which paired stimuli (e.g., gate voltage) are applied may be ascertained. As the interval $\Delta t$ (i.e., $\Delta t_{interval}$) between paired stimuli decreases, $\Delta W$ (%) may increase. For example, when a timing (or a time interval) $\Delta I_{interval}$ between a first pulse and a second pulse successively following the first pulse increases while keeping the magnitudes and durations of the first and second pulses substantially the same, the increment of the post-synaptic current (PSC) (e.g., the maximum increase in magnitude of the PSC) of the synaptic device decreases as shown in FIG. 10. This also appears in biological synapses and may be referred to as a STDP characteristic. In particular, as $\Delta t$ approaches 0 in a range of about $-15$ µs to $15$ µs, $\Delta W$ (%) tends to increase.

As described with reference to FIGS. 6 to 10, a synaptic device according to an embodiment of the present invention may have all of the SADP characteristic, the SDDP characteristic, the SFDP characteristic, the SNDP characteristic, and the STDP characteristic. Therefore, such a synaptic device according to an embodiment may be used as an artificial synapse that may replace a biological synapse, and may be usefully employed in a neuromorphic device, a neuromorphic system, and/or a neural network.

A method of operating a synaptic device according to an embodiment of the present disclosure is explained as follows.

The method of operating a synaptic device may include preparing a synaptic device including a channel, a charge trap layer directly in contact with the channel, a blocking insulating layer disposed on the charge trap layer, a gate electrode disposed on the blocking insulating layer, a source connected to a first region of the channel and a drain connected to a second region of the channel, and applying a gate voltage to the gate electrode of the synaptic device. Depending on an application condition of the gate voltage, a post-synaptic current (PSC) of the synaptic device may be changed and synaptic plasticity of the synaptic device may be controlled. In an embodiment, a method of operating a synaptic device may include applying a control signal to a control electrode of the synaptic device to control a post-synaptic current (PSC) and synaptic plasticity of the synaptic device, and outputting the PSC to generate a post-spike signal. Such a synaptic device may include a channel, a charge trap layer directly contacting the channel, a blocking insulating layer disposed on the charge trap layer, the control electrode disposed on the blocking insulating layer, a first terminal connected to a first region of the channel, and a second terminal connected to a second region of the channel.

The gate electrode may include silicon, the blocking insulating layer may include an oxide, the charge trap layer may include a nitride, and the channel may include silicon.

For example, the synaptic device may have a SONS (doped poly-silicon/blocking oxide/charge trap nitride/silicon channel) structure. The synaptic device may have a characteristic in which charges trapped in the charge trap layer due to the application of the gate voltage are diffused and outflowed to the channel over time. In addition, the synaptic plasticity of the synaptic device may be controlled according to one or more of an amplitude, a duration, a frequency, a number, and a timing of a pulse of the gate voltage. The synaptic device may have a spike amplitude dependent plasticity (SADP) characteristic, a spike duration dependent plasticity (SDDP) characteristic, a spike frequency dependent plasticity (SFDP) characteristic, a spike number dependent plasticity (SNDP) characteristic, and a spike timing dependent plasticity (STDP) characteristic.

It may be understood that the operating method of the synaptic device according to the embodiment may include the structural and operational characteristics as described with reference to FIGS. 1, 2, and 4 to 10. Therefore, the contents described with reference to FIGS. 1, 2, 4 to 10 may be applied to the method of operating the synaptic device.

When a synapse which is a connection between a pre-neuron and a post-neuron is implemented using a circuit, the synaptic device according to an embodiment of the present disclosure may be applied. A pre-neuron may input a pre-spike signal into a synapse, the synapse may transmit a synaptic signal to a post-neuron, and the post-neuron may generate a post-spike signal. Similar to the method in which a synapse connects a pre-neuron and a post-neuron, the synaptic device may play a role to connect a pre-synaptic neuron circuit and a post-synaptic neuron circuit. A diagram illustrating this configuration may be shown as a circuit in FIG. 11.

Figure 11:
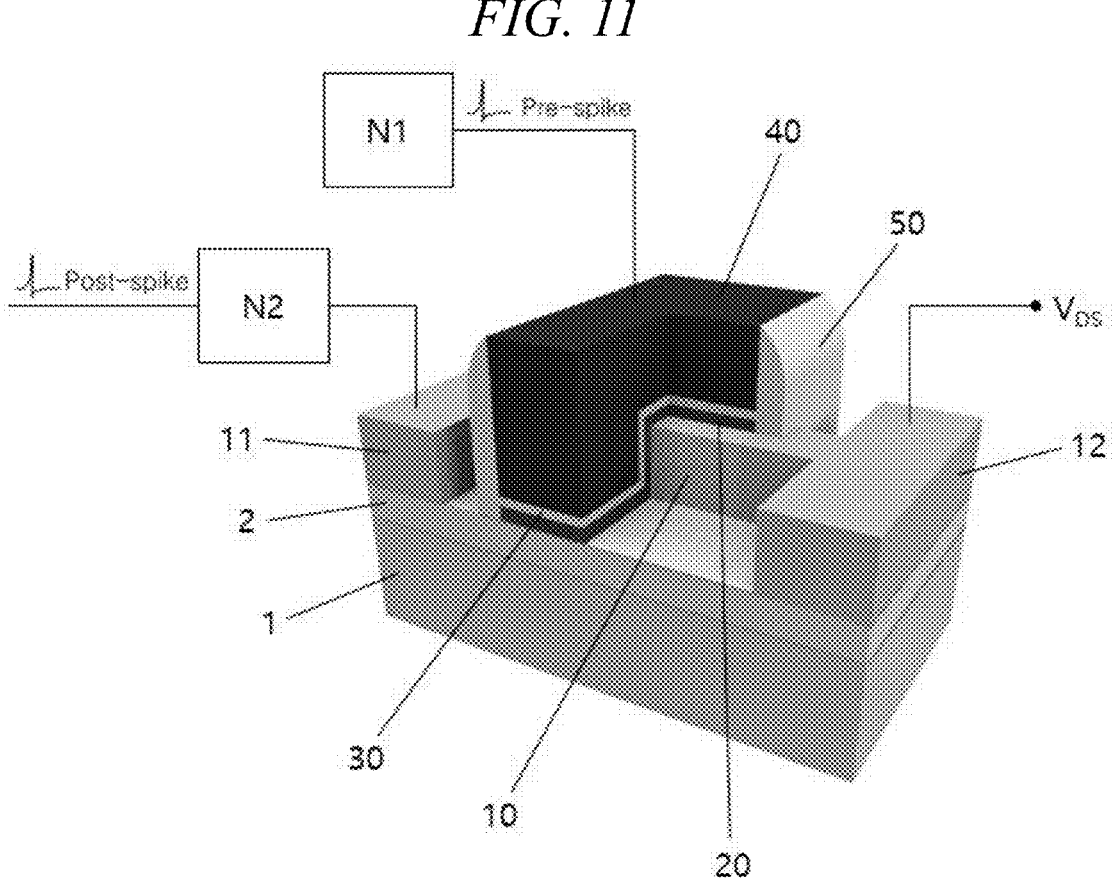
FIG. 11 is a perspective view showing a circuit configuration including a synaptic device according to an embodiment of the present disclosure.

FIG. 11 is a perspective view showing a circuit configuration including a synaptic device according to an embodiment of the present disclosure.

Referring to FIG. 11, the gate electrode 40 of the synaptic device may be connected to a pre-synaptic neuron circuit N1. The source 11 of the synaptic device may be connected to a post-synaptic neuron circuit N2. A pre-spike signal may be applied to the gate electrode 40 from the pre-synaptic neuron circuit N1, and a post-synaptic current may flow to the post-synaptic neuron circuit N2 through the source 11. A post-spike signal may be generated from the postsynaptic neuron circuit N2. Meanwhile, a predetermined voltage $V_{DS}$ may be constantly applied to the drain 12 of the synaptic device. That is, a predetermined voltage $V_{DS}$ having a substantially constant level may be applied to the drain 12.

Figure 12:
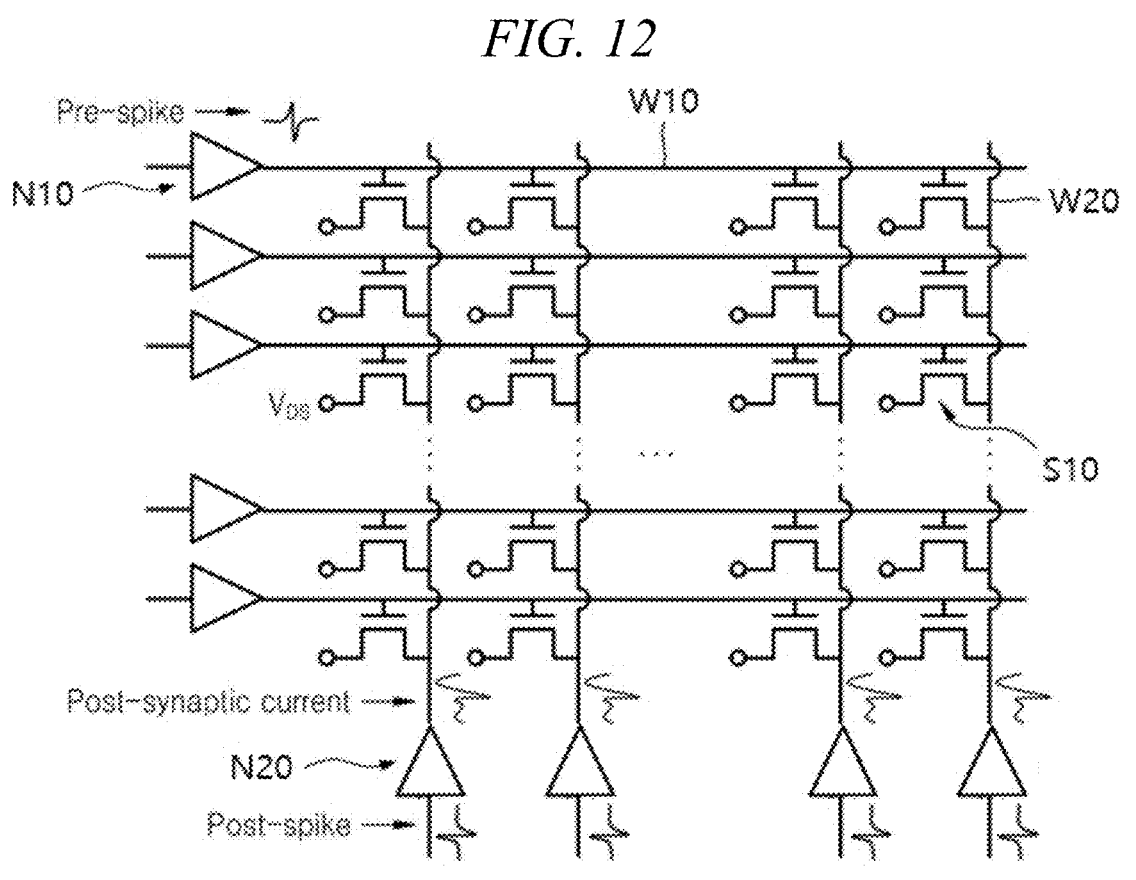

FIG. 12 is a circuit diagram showing a synaptic array device to which a synaptic device (e.g., the synaptic device shown in FIG. 1) S10 according to an embodiment of the present disclosure is applied as a unit device.

Referring to FIG. 12, a plurality of synaptic devices S10 may be arranged to form a plurality of columns and a plurality of rows. A plurality of first wirings W10 may be arranged, and a plurality of second wirings W20 crossing them may be arranged, and the synaptic device S10 may be provided at the intersection of the first wiring W10 and the second wiring W20. The plurality of first wires W10 may be connected to the gate electrode (e.g., the gate electrode 40 shown in FIG. 1) of the synaptic device S10, and the plurality of second wires W20 may be connected to the source (e.g., the source 11 shown in FIG. 1) of the synaptic device S10. The first wiring W10 may be connected to a pre-synaptic neuron circuit N10, and the second wiring W20 may be connected to a post-synaptic neuron circuit N20.

Meanwhile, a predetermined voltage Vps may be applied to the drain of the synaptic device S10.

A pre-spike signal may be applied from the pre-synaptic neuron circuit N10 to the gate electrode of the synaptic device S10 through the first wire W10. A post-synaptic current may flow to a post-synaptic neuron circuit N20 through the source of the synaptic device S10. A post-spike signal may be generated from the post-synaptic neuron circuit N20 based on the post-synaptic current.

According to an embodiment of the present disclosure, it is possible to configure a neuromorphic device and/or a neuromorphic system to which one or more synaptic devices according to the above embodiments are applied. A neuromorphic device may include a CMOS peripheral circuit connected to the synaptic devices of a synaptic array device. The CMOS peripheral circuit may include a pre-synaptic neuron circuit, a post-synaptic neuron circuit and the like. The synaptic array device according to an embodiment of the present disclosure, for example, may have an array structure as described in FIG. 12. Known aspects of the configuration of a neuromorphic device and/or a neuromorphic system in the art may be omitted herein for the interest of brevity. Since the synaptic device according to an embodiment of the present disclosure is compatible with CMOS technology, it is possible to easily implement a neuromorphic device including the synaptic device and a CMOS peripheral circuit.

According to the embodiments of the present disclosure described above, it is possible to implement a synaptic device capable of imitating various synaptic behaviors of biological synapses, and having excellent process compatibility with CMOS technology, and an operation method thereof. In particular, it is possible to implement a synaptic device in which a post-synaptic current (PSC) is changed and synaptic plasticity is easily controlled according to the application condition of the gate voltage applied to the gate electrode. More specifically, in connection with the synaptic device according to the embodiment, for example, synaptic plasticity may be controlled according to the amplitude, duration, frequency, number, and timing of a pulse signal applied to a gate electrode; and the synaptic device may exhibit a spike amplitude dependent plasticity (SADP) characteristic, a spike duration dependent plasticity (SDDP) characteristic, a spike frequency dependent plasticity (SFDP) characteristic, a spike number dependent plasticity (SNDP) characteristic, and a spike timing dependent plasticity (STDP) characteristic. In addition, the synaptic device according to the embodiment may be compatible with conventional CMOS technology. Therefore, the synaptic device according to the embodiment may be used as an artificial synapse which may replace a biological synapse, and may be usefully employed in a neuromorphic device, a neuromorphic system, and/or a neural network.

In the present specification, specific embodiments of the present disclosure have been disclosed, and although specific terms are used, these are only used in a general sense to easily describe the technological contents of embodiments of the present disclosure and to help the understanding of these embodiments of the present disclosure, and are not used to limit the scope of embodiments of the present disclosure. Other modifications based on the technological spirit of the present disclosure may be implemented in addition to the embodiments disclosed herein. A synaptic device, a neuromorphic device including the same, and operation methods thereof according to the embodiments described with reference to FIGS. 1 to 12 may be variously substituted, changed, and/or modified without departing from the spirit of the present disclosure. Therefore, the scope of the invention should not be determined by the described embodiments, but should be determined by the technological concepts described in the claims.

EXPLANATION OF SYMBOLS

| * Explanation of symbols for the main parts of the drawing * | |
| --- | --- |
| 1: lower substrate layer | 2: insulating layer |
| 10: channel | 11: source |
| 12: drain | 20: charge trap layer |
| 30: blocking insulating layer | 40: gate electrode |
| 50: side wall insulating layer | N1: pre-synaptic neuron circuit |
| N2: post-synaptic neuron circuit | N10: pre-synaptic neuron circuit |
| N20: post-synaptic neuron circuit | S10: synaptic device |
| W10: first wiring | W20: second wiring |

What is claimed is:

1. A synaptic device comprising:
a channel;
a charge trap layer directly contacting the channel;
a blocking insulating layer disposed on the charge trap layer;
a control electrode disposed on the blocking insulating layer;
a first terminal connected to a first region of the channel; and
a second terminal connected to a second region of the channel;
wherein the synaptic device is configured to change a post-synaptic current (PSC) and control synaptic plasticity according to a control signal applied to the control electrode.

2. The synaptic device of claim 1, wherein the control electrode is a gate electrode, the first terminal is a source, the second terminal is a drain, and
wherein the PSC is a current flowing between the source and the drain, and the control signal is a gate voltage.

3. The synaptic device of claim 2, wherein the synaptic device has a SONS structure.

4. The synaptic device of claim 2, wherein the gate electrode includes silicon, the blocking insulating layer includes an oxide, the charge trap layer includes a nitride, and the channel includes silicon.

5. The synaptic device of claim 2, wherein the synaptic device has a characteristic that charges trapped in the charge trap layer in response to application of the gate voltage are diffused and outflowed to the channel over time.

6. The synaptic device of claim 2, wherein the synaptic device controls the synaptic plasticity according to one or more of an amplitude, a duration, a frequency, a number, and a timing of a pulse of the gate voltage.

7. The synaptic device of claim 1, wherein the synaptic device has a spike amplitude dependent plasticity (SADP) characteristic, a spike duration dependent plasticity (SDDP) characteristic, a spike frequency dependent plasticity (SFDP) characteristic, a spike number dependent plasticity (SNDP) characteristic, and a spike timing dependent plasticity (STDP) characteristic.

8. The synaptic device of claim 1, wherein the synaptic device has a paired-pulse facilitation (PPF) characteristic.

9. A neuromorphic device comprising the synaptic device according to claim 1.

10. The neuromorphic device of claim 9, further comprising a CMOS peripheral circuit connected to the synaptic device.

11. The neuromorphic device of claim 10, wherein the control electrode is a gate electrode, the first terminal is a source, the second terminal is a drain, and
wherein the PSC is a current flowing between the source and the drain, and the control signal is a gate voltage.

12. The neuromorphic device of claim 11, wherein the CMOS peripheral circuit includes:
a pre-synaptic neuron circuit configured to apply a pre-spike signal to the gate electrode of the synaptic device; and
a post-synaptic neuron circuit configured to receive the PSC through the source of the synaptic device.

13. A method of operating a synaptic device, the method comprising:
applying a control signal to a control electrode of the synaptic device to control a post-synaptic current (PSC) and synaptic plasticity of the synaptic device; and
outputting the PSC to generate a post-spike signal,
wherein the synaptic device includes a channel, a charge trap layer directly contacting the channel, a blocking insulating layer disposed on the charge trap layer, the control electrode disposed on the blocking insulating layer, a first terminal connected to a first region of the channel, and a second terminal connected to a second region of the channel.

14. The method of claim 13, wherein the control electrode is a gate electrode, the first terminal is a source, the second terminal is a drain, and
wherein the PSC is a current flowing between the source and the drain, and the control signal is a gate voltage.

15. The method of claim 14, wherein the synaptic device has a SONS structure.

16. The method of claim 14, wherein the gate electrode includes silicon, the blocking insulating layer includes an oxide, the charge trap layer includes a nitride, and the channel includes silicon.

17. The method of claim 14, wherein the synaptic device has a characteristic that charges trapped in the charge trap layer in response to the application of the gate voltage are diffused and outflowed to the channel over time.

18. The method of claim 14, wherein the synaptic plasticity is controlled according to one or more of a amplitude, a duration, a frequency, a number, and a timing of a pulse of the gate voltage.

19. The method claim 13, wherein the synaptic device has a spike amplitude dependent plasticity (SADP) characteristic, a spike duration dependent plasticity (SDDP) characteristic, a spike frequency dependent plasticity (SFDP) characteristic, a spike number dependent plasticity (SNDP) characteristic, and a spike timing dependent plasticity (STDP) characteristic.

20. The method of claim 13, wherein the synaptic device has a paired-pulse facilitation (PPF) characteristic.

* * * * *